United States Patent
Kim et al.

(10) Patent No.: US 8,222,697 B2
(45) Date of Patent: Jul. 17, 2012

(54) CMOS RF IC

(75) Inventors: Yu Sin Kim, Daejeon-si (KR); Chang Seok Lee, Daejeon-si (KR); Nam Jin Oh, Daejeon-si (KR); Shinichi Iizuka, Suwon-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 61 days.

(21) Appl. No.: 12/273,719

(22) Filed: Nov. 19, 2008

(65) Prior Publication Data

US 2010/0090752 A1   Apr. 15, 2010

(30) Foreign Application Priority Data

Oct. 13, 2008   (KR) .................. 10-2008-0100212

(51) Int. Cl.
*H01L 27/12* (2006.01)
(52) U.S. Cl. ................. 257/350; 257/E21.022; 257/537

(58) Field of Classification Search .................. 257/350, 257/E21.022, 537
See application file for complete search history.

(56) References Cited

U.S. PATENT DOCUMENTS

| 6,121,809 A * | 9/2000 | Ma et al. ........................ 327/246 |
| 2004/0140528 A1* | 7/2004 | Kim et al. ....................... 257/537 |
| 2006/0091958 A1* | 5/2006 | Bhatti et al. .................... 330/295 |

FOREIGN PATENT DOCUMENTS

| KR | 1020040111583 A | 12/2004 |
| KR | 1020050009648 | * 1/2005 |
| KR | 1020050009648 A | 1/2005 |

* cited by examiner

*Primary Examiner* — Tony Tran
(74) *Attorney, Agent, or Firm* — Lowe, Hauptman, Ham & Berner, LLP

(57) ABSTRACT

Provided is a CMOS RF IC comprises an inductor that is formed in the uppermost two or more metal layers among a plurality of metal layers; and a DC bias circuit that is formed in a metal layer provided at the bottom of the metal layers in which the inductor is formed.

1 Claim, 4 Drawing Sheets

[FIG. 1]
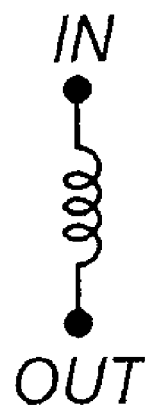
[FIG. 2]
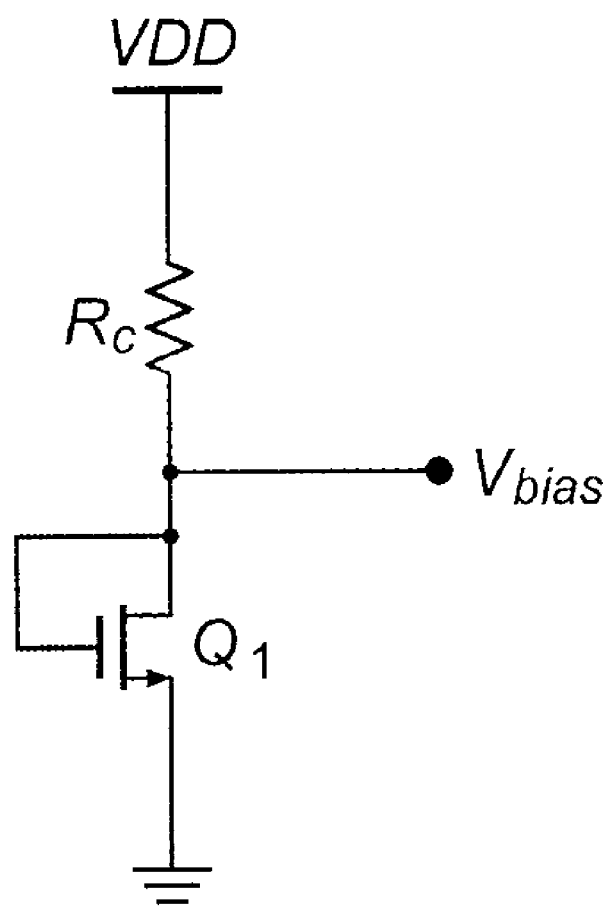

[FIG. 3]
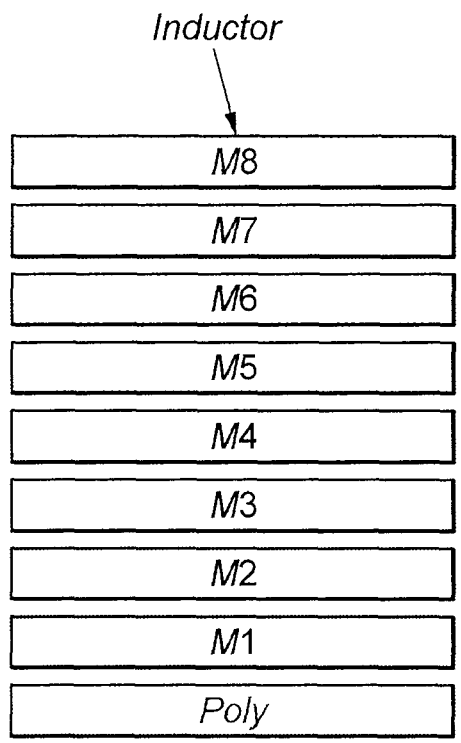
[FIG. 4]
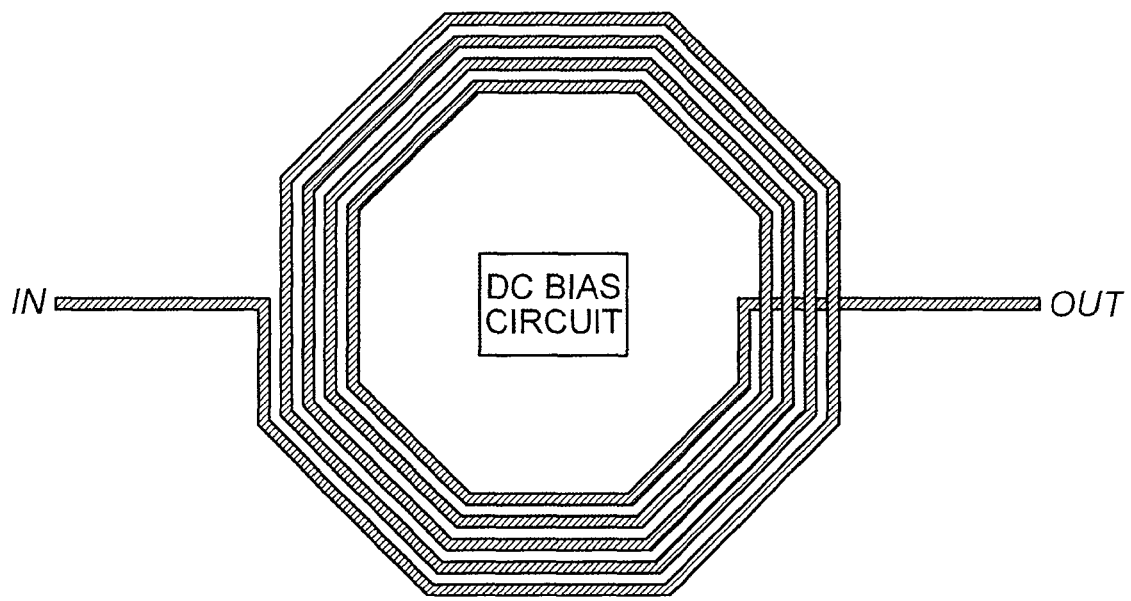

[FIG. 5]
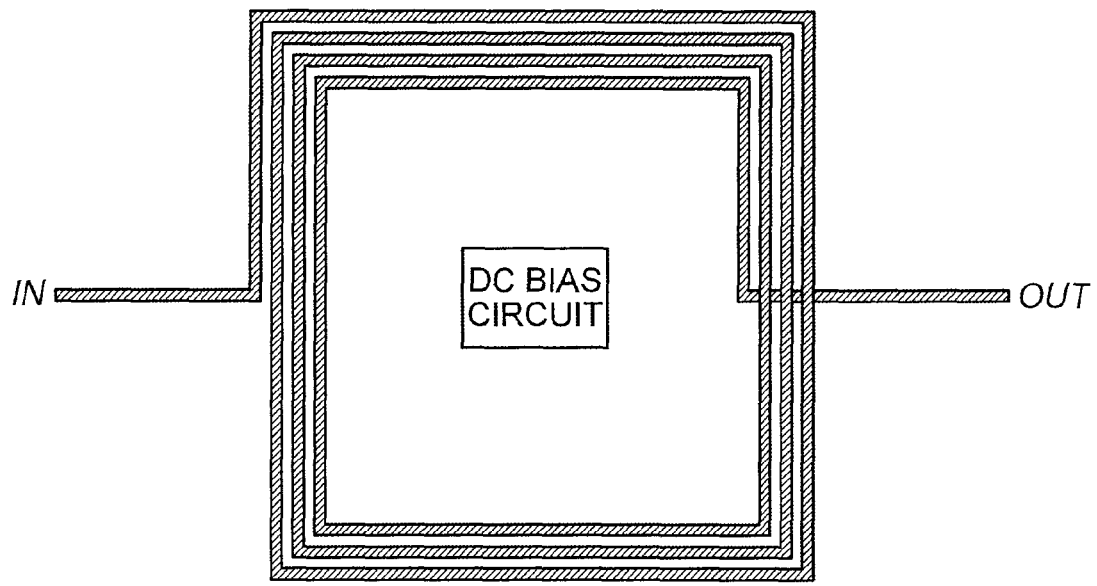
[FIG. 6]
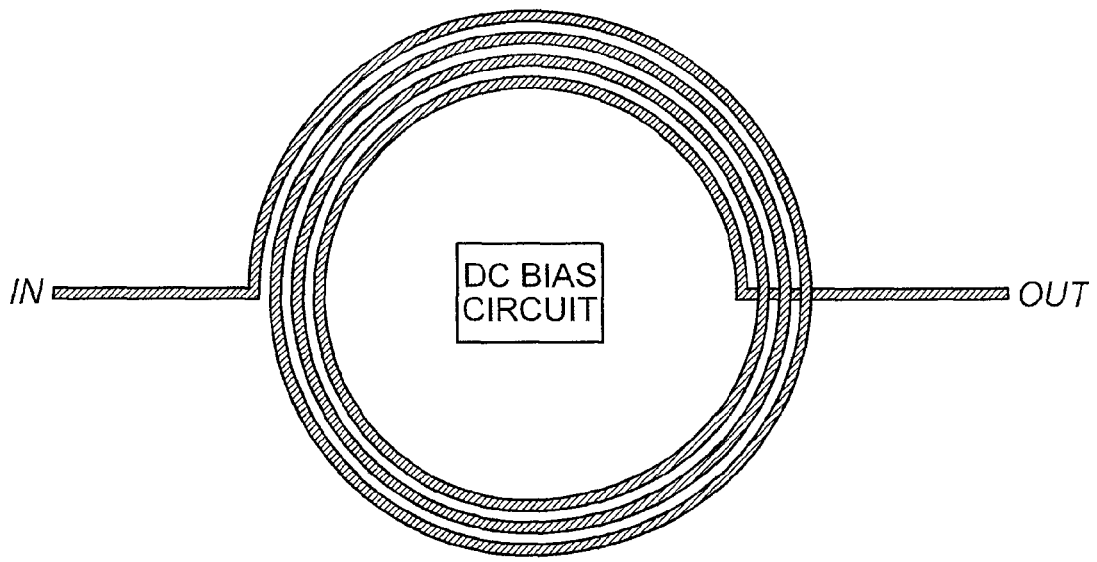

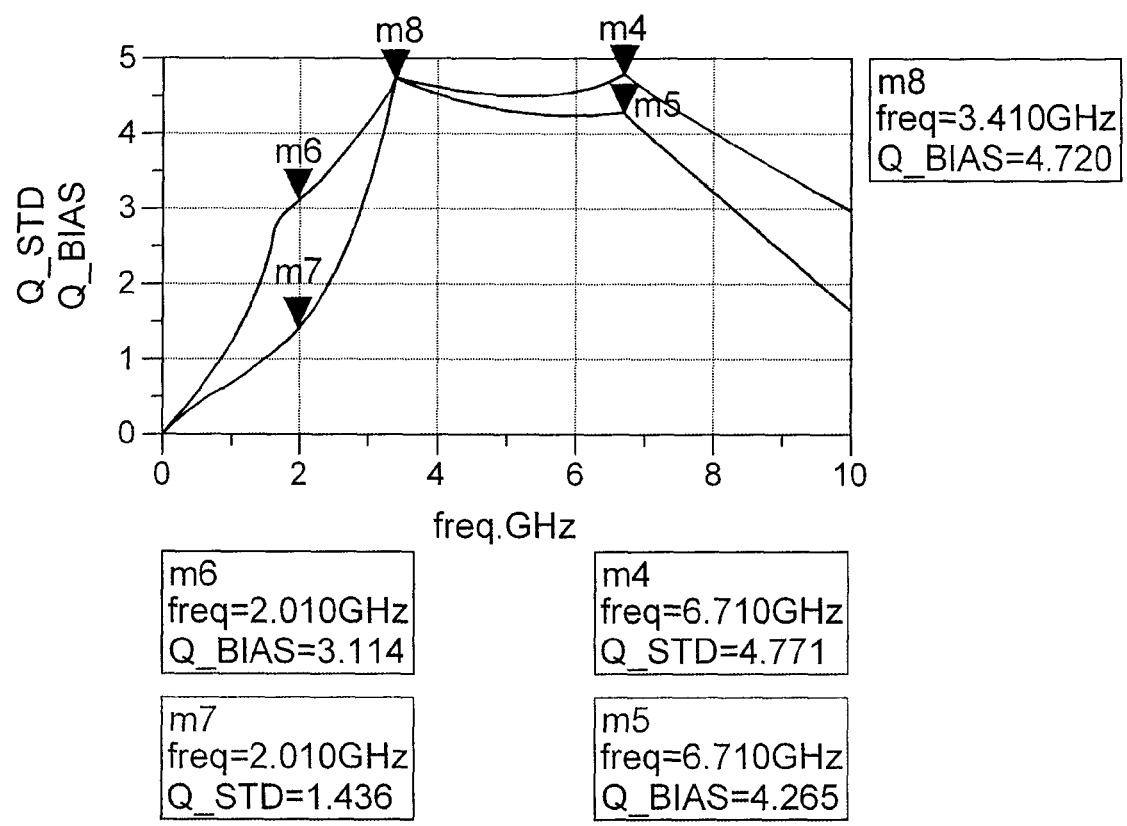
[FIG. 7]

CMOS RF IC

CROSS-REFERENCE TO RELATED APPLICATIONS

This application claims the benefit of Korean Patent Application No. 10-2008-100212 filed with the Korea Intellectual Property Office on Oct. 13, 2008, the disclosure of which is incorporated herein by reference.

BACKGROUND OF THE INVENTION

1. Field of the Invention

The present invention relates to a complementary metal-oxide semiconductor (CMOS) radio frequency integrated circuit (RF IC), and more specifically, to a CMOS RF IC in which a DC bias circuit which is hardly affected by parasitic components is formed in a metal layer provided at the bottom of a metal layer in which an inductor is formed, while the size thereof is maintained.

2. Description of the Related Art

In general, an RF IC is referred to as a circuit in which an RF circuit is implemented on one semiconductor chip by using active and passive elements. The RF IC includes an amplifier, a transmitter/receiver, a synthesizer, and so on.

Further, CMOS is an element which is formed of silicon and has an excellent frequency characteristic in accordance with the development of micro-processing technology. Since the CMOS is based on silicon, chips can be manufactured at a low price by using a well-developed processing technique. Further, in the case of system-on-chip (SoC), even an intermediate frequency band of a system and a digital unit can be integrated.

An inductor is an essential element for implementing the CMOS technology in the RF IC. However, since an area occupied by the inductor in the IC is large at an RF band, there are difficulties in reducing the size of the chip.

Therefore, to reduce the chip size of the CMOS RF IC, a lot of studies have been conducted to reduce the size of the inductor. However, when the size is reduced, the performance of the CMOS RF IC may be degraded.

SUMMARY OF THE INVENTION

An advantage of the present invention is that it provides a CMOS RF IC in which a DC bias circuit which is hardly affected by parasitic components is formed in a metal layer provided at the bottom of a metal layer in which an inductor is formed, thereby reducing a chip size, while the size thereof is maintained.

Additional aspect and advantages of the present general inventive concept will be set forth in part in the description which follows and, in part, will be obvious from the description, or may be learned by practice of the general inventive concept.

According to an aspect of the invention, a CMOS RF IC comprises an inductor that is formed in the uppermost two or more metal layers among a plurality of metal layers; and a DC bias circuit that is formed in a metal layer provided at the bottom of the metal layers in which the inductor is formed.

One end of the inductor may be positioned in the uppermost layer among the plurality of metal layers, and the other end thereof may be positioned in the metal layer provided at the bottom of the uppermost layer.

The inductor may be formed in a polygonal shape. Alternatively, the inductor may be formed in a circular shape.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a diagram showing a symbol of an inductor formed in a CMOS RF IC according to the present inventive concept;

FIG. 2 is a circuit diagram of a DC bias circuit formed in the CMOS RF IC according to the present inventive concept;

FIG. 3 is a cross-sectional view of a CMOS semiconductor substrate including a plurality of metal layers;

FIG. 4 is a diagram showing a CMOS RF IC according to a first embodiment of the present inventive concept;

FIG. 5 is a diagram showing a CMOS RF IC according to a second embodiment of the present inventive concept;

FIG. 6 is a diagram showing a CMOS RF IC according to a third embodiment of the present inventive concept; and FIG. 7 is a graph showing a quality factor (Q) characteristic of the CMOS RF IC according to the present inventive concept.

DETAILED DESCRIPTION OF THE PREFERRED EMBODIMENTS

The present inventive concept will now be described more fully with reference to the accompanying drawings, in which exemplary embodiments of the invention are shown. The present inventive concept may, however, be embodied in many different forms and should not be construed as being limited to the embodiments set forth herein; rather, these embodiments are provided so that this disclosure will be thorough and complete, and will fully convey the concept of the invention to those skilled in the art. In the following description, well-known functions or constructions are not described in detail since they would obscure the invention in unnecessary detail.

Although terms like "first" and "second" are used to describe various elements, these elements are not limited to these terms. These terms are used only to differentiate one element from another.

Terms used herein are for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, numbers, steps, operations, elements, components, and/or groups thereof, but do not preclude the presence or addition of one or more other features, numbers, steps, operations, elements, components, and/or groups thereof.

Hereinafter, a CMOS RF IC according to an embodiment of the present inventive concept will be described in detail with reference with the accompanying drawings. In the following description, like reference numerals denote like elements throughout, and duplicated description will be omitted.

In general, a CMOS RF IC may include an amplifier, a transmitter/receiver, a synthesizer, and so on. A transistor composing the amplifier requires a DC bias circuit for implementing an amplification function. Further, the RF IC requires an inductor as an essential element for implementing CMOS technology.

In the CMOS RF IC, however, the inductor occupies a large area in the entire chip. Accordingly, attempts to reduce the size of the inductor have been continuously made.

A multilayer inductor may be taken as an example of the inductor of which the size is reduced. However, when the size of the inductor is reduced, the entire chip size can be reduced, but the performance thereof may be degraded.

Accordingly, studies have been conducted, in which while the size of the inductor is maintained, a different element is formed in a layer provided at the bottom of the inductor, thereby reducing the entire chip size.

FIG. 1 is a diagram showing a symbol of an inductor formed in a CMOS RF IC according to the present inventive concept. FIG. 2 is a circuit diagram of a DC bias circuit formed in the CMOS RF IC according to the present inventive concept. FIG. 3 is a cross-sectional view of a CMOS semiconductor substrate including a plurality of metal layers. FIG. 4 is a diagram showing a CMOS RF IC according to a first embodiment of the present inventive concept.

Referring to FIGS. 1 to 4, the CMOS RF IC may include an inductor and a DC bias circuit.

The inductor may be formed in the uppermost two metal layers among the plurality of metal layers included in the CMOS semiconductor substrate.

The DC bias circuit may be formed in a metal layer provided at the bottom of the metal layers in which the inductor is formed, among the plurality of metal layers.

In the case of the inductor, parasitic components are formed around the inductor. When other elements composing the CMOS RF IC are formed under the inductor, the elements may be affected by the parasitic components. In this case, the CMOS RF IC may malfunction. However, since the DC bias circuit is not affected by the parasitic components, the DC bias circuit may be formed under the inductor.

Further, when the inductor is formed, one end of the inductor may be positioned in the uppermost layer among the plurality of metal layers, and the other end thereof may be positioned in the lower layer of the uppermost layer.

The inductor may be formed in an octagonal shape.

Referring to FIG. 3, the inductor is formed in seventh and eighth layers, and the DC bias circuit is formed by selectively using a plurality of layers from a poly layer to the seventh layer.

FIG. 5 is a diagram showing a CMOS RF IC according to a second embodiment of the present inventive concept.

In the CMOS RF IC according to the second embodiment of the present inventive concept, an inductor formed in a metal layer may have a rectangular shape, as shown in FIG. 5.

FIG. 6 is a diagram showing a CMOS RF IC according to a third embodiment of the present inventive concept.

In the CMOS RF IC according to the third embodiment of the present inventive concept, an inductor formed in a metal layer may have a circular shape, as shown in FIG. 6.

Without being limited to the above-described embodiments, the inductor may be formed to have various shapes such as a polygonal shape.

FIG. 7 is a graph showing a quality factor (Q) characteristic of the CMOS RF IC according to the present inventive concept.

Referring to FIG. 7, a Q characteristic Q_STD when only an inductor is provided will be compared with a Q characteristic Q_BIAS when a DC bias circuit is formed in a layer provided at the bottom of an inductor.

As a result of electromagnetic (EM) simulation, it can be found that the Q characteristic Q_BIAS is more excellent than the Q characteristic Q_STD in a range of 100 MHz to 3.4 GHz. Further, the Q characteristic Q_BIAS is degraded in a range of 4 to 6.7 GHz, compared with the Q characteristic Q_STD. In particular, the Q characteristic Q_BIAS at 6.7 GHz decreases as much as 11%, compared with the Q characteristic Q_STD.

Therefore, the Q characteristic of the CMOS RF IC according to the present inventive concept can be improved in a range of 100 MHz to 3.4 GHz, without degradation of performance. Further, although the Q characteristic at 6.7 GHz decreases as much as 11%, the CMOS RF IC can be selectively used in a circuit requiring a low Q characteristic.

Therefore, as the DC bias circuit is disposed under the inductor, the CMOS RF IC has an enhanced Q characteristic in a predetermined range of frequency band, without the degradation of performance. Further, it is possible to reduce the entire chip size.

According to the present inventive concept, the DC bias circuit which is hardly affected by parasitic components is formed in the layer provided at the bottom of the inductor while the size of the inductor is maintained. Therefore, it is possible to reduce the chip size and to minimize the performance degradation of the inductor.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A complementary metal-oxide semiconductor (CMOS) radio frequency integrated circuit (RF IC) comprising:
   an amplifier;
   an inductor that is formed in two or more uppermost metal layers among a plurality of metal layers; and
   a DC bias circuit that is formed in a metal layer provided at the bottom of the metal layers in which the inductor is formed, the DC bias circuit being coupled to the amplifier and configured to supply a bias voltage to the amplifier,
   wherein the DC bias circuit comprises
   a power terminal,
   a resistor of which one end is connected to the power terminal,
   a transistor of which one end is connected to another end of the resistor and the transistor another end connected to a ground,
   a control terminal is connected to the another end of the resistor so as to supply the bias voltage to the amplifier,
   wherein the DC bias circuit is electrically disconnected from the inductor,
   wherein one end of the inductor is positioned in the uppermost layer among the plurality of metal layers, and the other end thereof is positioned in the metal layer provided at the bottom of the uppermost layers, and
   wherein the inductor is formed in a polygonal shape.

* * * * *